United States Patent [19]

Galpin

[11] 3,882,330

[45] May 6, 1975

[54] CIRCUIT ARRANGEMENTS

[75] Inventor: Robert Keith Portway Galpin, Marlow, England

[73] Assignee: Plessy Handel und Investments A.G., Zug, Switzerland

[22] Filed: Apr. 11, 1973

[21] Appl. No.: 350,213

[30] Foreign Application Priority Data

Apr. 13, 1972 United Kingdom.............. 17111/72

[52] U.S. Cl. ................ 307/264; 307/237; 328/155; 328/167; 328/172; 333/28

[51] Int. Cl. ............................................ H03k 1/14

[58] Field of Search ...... 307/237, 262, 264; 328/55, 328/155, 167, 172; 333/28

[56] References Cited

OTHER PUBLICATIONS

D. Hirsch et al., "A Simple Adaptive Equalizer for Efficient Data Transmission," I.E.E.E. Transactions on Communication Technology, Com-18 No. 1, February, 1970, pp. 5–11.

*Primary Examiner*—John Zazworsky
*Attorney, Agent, or Firm*—Scrivener Parker Scrivener & Clarke

[57] ABSTRACT

A variety of linear variable gain elements are described for use in adaptive equalisers, the elements comprising an integrator for controlling the conductance of a field-effect transistor connected in the output thereof in dependence upon a signal/error voltage applied to the integrator, and a voltage source, the voltage of which is variable in dependence upon an applied electrical signal connected to the field-effect transistor and to a further impedance, the outputs from each of which is selectively combined to afford the required output.

6 Claims, 8 Drawing Figures

CIRCUIT ARRANGEMENTS

Figure 1:
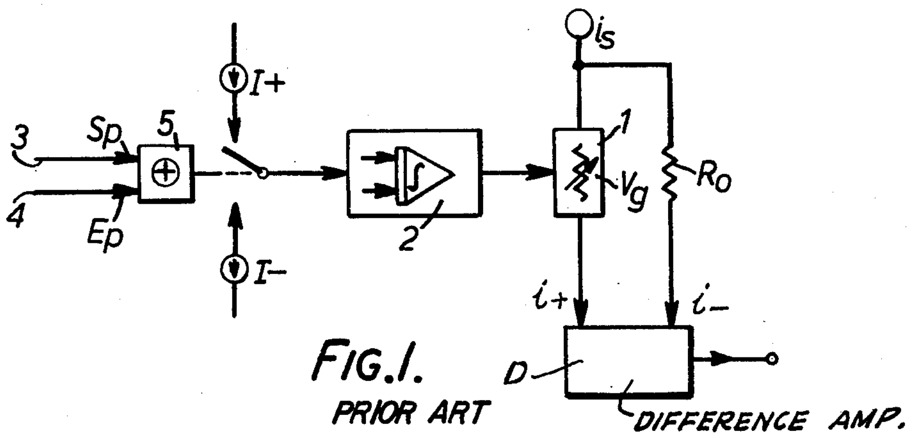
FIG. 1. PRIOR ART

This invention relates to circuit arrangements and relates more especially to variable gain circuit arrangements for use in or with adaptive equalisers.

The basic element of most automatic or adaptive equalisers is a tapped delay line, to the taps of which are connected variable gain amplifiers or attenuators. The equaliser operates by the adjustments of these variable gain elements according to one of a number of algorithms which, it is hoped, will lead to the minimising of the distortion of an input signal. Although the concept of such equalisers is visualised in terms of linear analogue signals, it is possible to convert the input signal into multilevel digital form and then realise the equaliser in digital hardware. This is done by some manufacturers to avoid the need for building LC delay lines and analogue variable gain elements.

The present invention describes a variety of linear variable gain elements for analogue signals for use with delay networks of the sampled-analogue type although they are equally applicable to equalisers using RC-active delay networks, RLC active delay networks, or passive LC delay networks (preferably with buffered tapping points).

According to the present invention a variable gain circuit arrangement for use in or with an adaptive equaliser comprises integrator means for controlling the conductance of field effect transistor means connected in the output thereof in dependence upon signal/error voltages applied to said integrator means, and a voltage source the voltage of which is variable in dependence upon an applied electrical signal connected to said field effect transistor means and to an electrical impedance, an output afforded by each of which is selectively combined.

In carrying out the invention there may be provided modulator means to which the signal/error voltages are applied, the output of the modulator means being fed to the integrator means, preferably via a charge resistance.

In one arrangement according to the invention the modulator means may take the form of a balanced modulator which is operated in dependence upon the output of the voltage source and a derived error signal.

Conveniently the balanced modulator may comprise differential amplifier means having two inputs, one of which is earthed, and an output, first resistor means connected in series with the other of said inputs and to the output of the voltage source, second resistor means connected between the output of the differential amplifier means and the said other input, second field effect transistor means for applying the output of said differential amplifier means to the charge resistance in dependence upon the polarity of an error signal and third field effect transistor means for applying the output of the voltage source to the charge resistance in dependence upon the inverse of the polarity applied to the second field effect transistor means.

Alternatively the balance modulator may comprise differential amplifier means having two inputs and an output, first and second resistor means connected respectively between one of said inputs and the output of the voltage source, third resistor means connected between the output of the differential amplifier means and one of said inputs and second field effect transistor means for causing the other of said inputs to be earthed in dependence upon the polarity of an error signal.

In another arrangement according to the invention the modulator means may be of unbalanced form, and the integrator means may comprise differential amplifier means having two inputs and an output, the charge resistance being connected in series with one of said inputs, and capacitor means connected between the output of the differential amplifier means and the said one input, the other of said inputs being connected to a tap (e.g. centre tap) of the electrical impedance.

In a first arrangement for carrying out the aforesaid another arrangement according to the invention the modulator means may comprise second field effect transistor means for connecting the output of the voltage source to the charge resistance in dependence upon the polarity of an error signal and third field effect transistor means for connecting the charge resistance to earth in dependence upon the inverse of the polarity applied to the said second field effect transistor means.

In a second arrangement for carrying out the aforesaid another arrangement according to the invention the modulator means may comprise second field effect transistor means for connecting the output of the voltage source to the input of the integrator means, and third field effect transistor means for connecting the input of the integrator means to earth, the second and third field resistor means being operated in dependence upon the magnitude and polarity of an error signal in combination with a signal dependent upon the threshold voltage of said transistor means, the arrangement being such that the resistance of the second and third transistor means affords the charge resistance connected in the input of the integrator means In a third arrangement for carrying out the aforesaid another arrangement according to the invention the modulator means may comprise differential amplifier means having two inputs and an output, first resistor means connected in series with one of said inputs, second resistor means connected between the output of the differential amplifier means and said one input, the other input of said differential amplifier means being connected to a further tap of the electrical impedance, second field effect transistor means for applying an error signal to the free end of the first resistor means in dependence upon the polarity of the output of the voltage source, and third field effect transistor means for applying the inverse of said error signal to the said free end of the first resistor means in dependence upon the inverse of the polarity of the output of the voltage source.

Adaptive equalisers incorporating a variable gain circuit arrangement as hereinbefore defined are also envisaged as being within the scope of the invention.

The foregoing and other features of the invention will now be described with reference to the accompanying drawings, in which;

FIG. 1 is a partially block schematic diagram of a known form of variable gain circuit; and FIGS. 2 to 7 are partially block schematic diagrams showing improvements in the arrangement of FIG. 1.

A variable gain element which makes use of the variable conductance of a field effect transistor (f.e.t.) has been described by Hirsch and Wolf in I.E.E.E. Transactions, Comm. Tech, COM-18 No. 1, February 1970, page 5 and in particular is shown in FIG. 9 thereof the essentials of which are shown in FIG. 1 of the accompanying drawings. The gate-channel voltage Vg of a f.e.t. 1 is provided by an integrator 2 which is fed with positive or negative pulses of current I+ or I−, dependent upon the addition of the polarity Sp of a signal sample and the polarity Ep of an error sample applied to inputs 3 and 4 respectively of a modulo-2 adder 5. The variable gain is effected by dividing a current $i_s$ which is proportional to the tap signal between the f.e.t. 1 and a fixed resistance Ro and feeding the divided currents *i+ and i−* to a difference amplifier D. Thus when the resistance of the f.e.t. 1 is equal to the fixed resistance Ro the tap gain is zero. In this way positive and negative gains can be produced.

This circuit has two basic disadvantages. Firstly, it can be shown that the conductance of a metal oxide silicon f.e.t. is approximately linearly proportional to the gate-channel voltage beyond the threshold voltage and that, by driving this current-sharing circuit from a current source, a non-linear relationship exists between tap gain and gate-channel voltage. Thus current pulses into the integrator, which cause fixed increments in gate-channel voltage, will cause different increments in gain depending upon the value of the existing gain. Secondly, the current pulses into the integrator are of fixed amplitude since they represent the binary value obtained from the modulo-2 addition of signal and error polarities. Thus the additional information contained in the error magnitude and the signal magnitude, which is valuable for rapid convergence and low residual error, is discarded.

Figure 2:
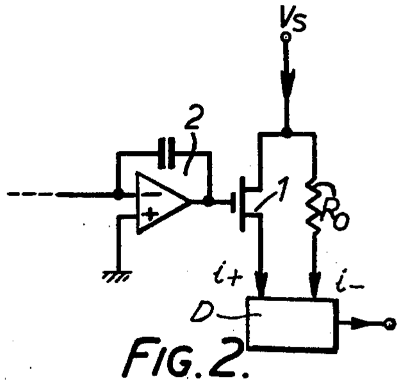

By replacing the current source $i_s$ of FIG. 1 with a voltage source Vs as in FIG. 2, the currents in the f.e.t. 1 and the fixed resistor Ro are made proportional to their respective conductances and independent of each other. This, with the approximately linear characteristic of the f.e.t. conductance with gate-channel voltage beyond threshold, gives a much more linear characteristic of gain versus gate-channel voltage.

Figure 3:
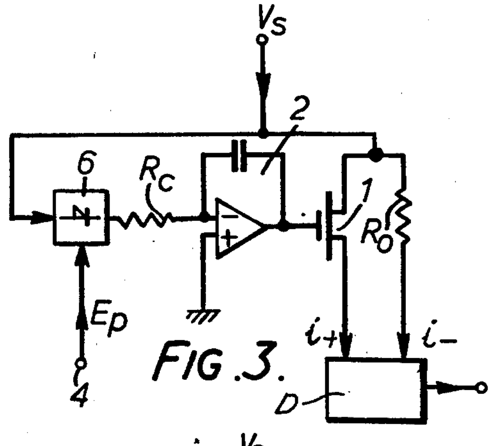

A further improvement of the arrangement of FIG. 1 is shown in FIG. 3. In this arrangement, the modulo-2 adder of FIG. 1 is replaced by a balanced modulator 6 and a charging resistor Rc. The charge into or out of the integrator 1 is then proportional to the polarity and amplitude of the signal Vs, multiplied by the error polarity Ep. This arrangement has far better convergence properties. Specific forms of balanced modulator 6 by way of example, are shown in FIGS. 4(*a*) and (*b*) and the balanced modulator that forms the basis of our copending Patent Application No. 16072/72 would also be suitable.

Figures 4A, 4B:
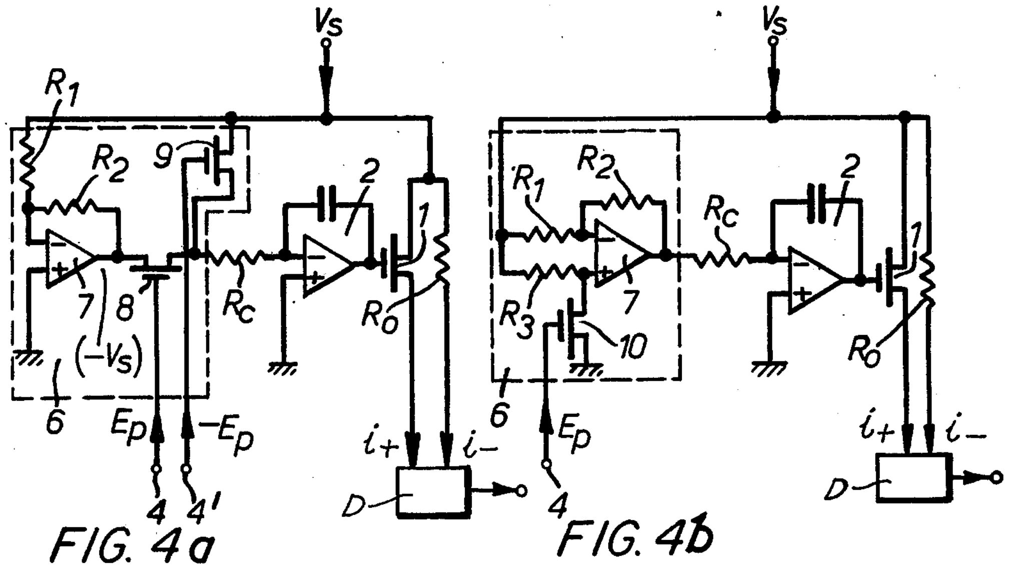

The balanced modulator 6 shown in FIG. 4(*a*) consists of a differential amplifier 7 the positive (+) input of which is grounded and the gain of which is defined by a series input resistor $R_1$ by means of which the voltage source Vs is applied to the negative (−) input thereof and a feedback resistor $R_2$ connected between the negative (−) input and the output of the differential amplifier. The output of the differential amplifier 7 is applied to the charging resistor Rc via a f.e.t. 8, the gate electrode of which has the signal Ep, which is indicative of the error signal polarity applied to it via an input 4 and the voltage source Vs is also applied to the charging resistor Rc via a further f.e.t. 9, the gate electrode of which has the inverse of the signal Ep i.e. −Ep applied to it via an input 4′.

The balanced modulator 6 shown in FIG. 4(*b*) is basically similar to that shown in FIG. 4(*a*) but in this case the positive (+) input of the differential amplifier 7 is connected to the voltage source Vs via a series resistor R3 and is also arranged to be connected to ground via a f.e.t. 10, the gate electrode of which has the signal Ep applied to it via input 4. The output of the differential amplifier 7 is then applied directly to the charging resistor Rc.

Figures 5, 6, 7:
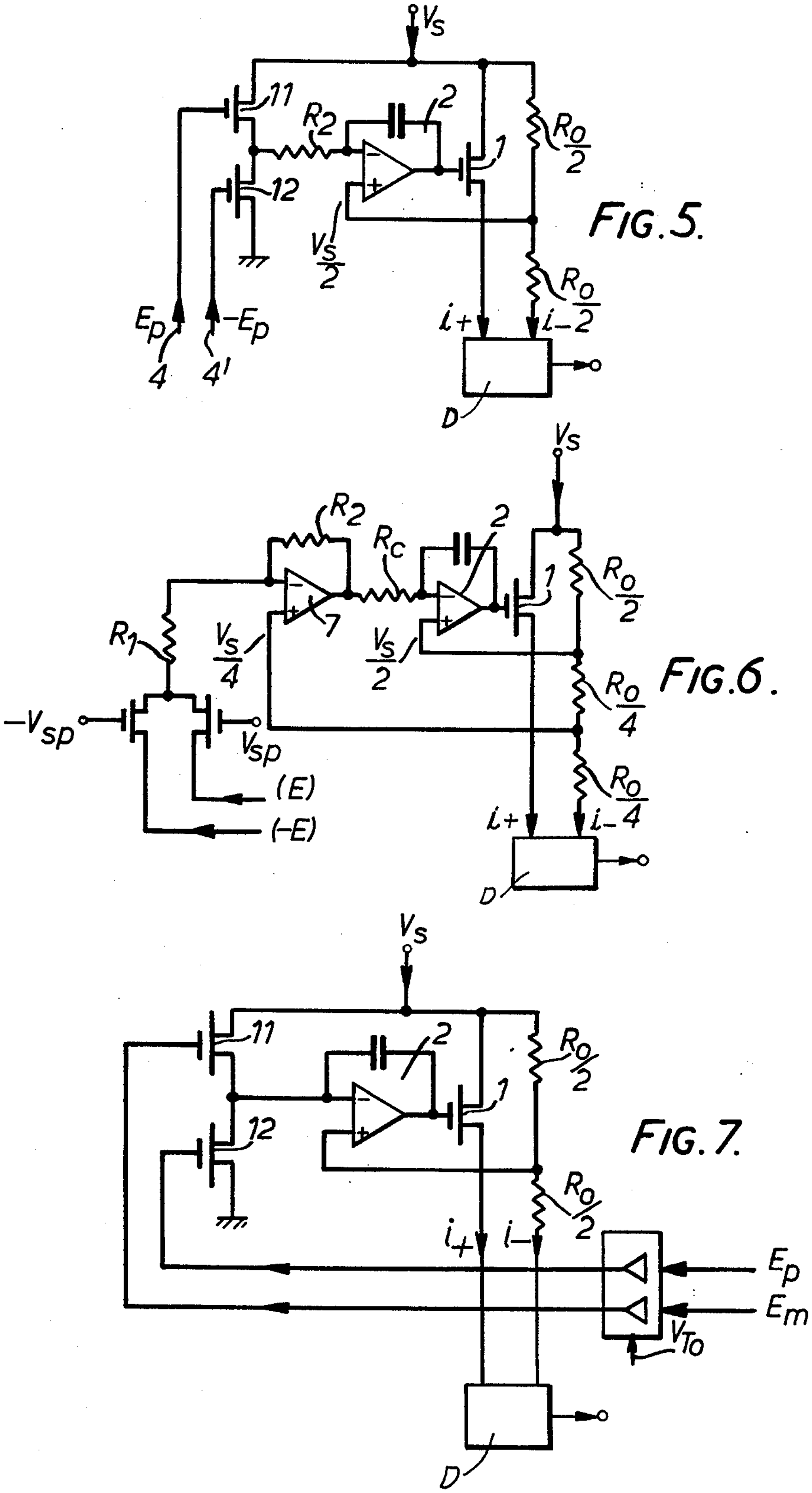

The linear signal handling capability of the f.e.t. can be increased as described by Hirsch and Wolf by adding half the tap signal voltage to the gate voltage. A method of implementing this is shown in FIG. 5 where the midpoint of the fixed resistor Ro is connected to the integrator 2. If this technique is used, the circuits of FIG. 4(*a*) and (*b*) would lead to unequal charging voltages for positive and negative errors.

Satisfactory operation is restored by the improvement shown in FIG. 5 where the inverting modulator is replaced by an unbalanced modulator consisting of two f.e.t.'s 11 and 12 effective for applying the voltage source Vs and ground respectively to the charging resistor Rc, the gate electrode of f.e.t. 11 having the signal Ep applied to it via input 4 and the gate electrode of f.e.t. 12 having the inverse of the signal Ep i.e. −Ep applied to it via input 4′. The operation is as follows:

If the signal Vs is connected to the integrator 2 the voltage across the charging resistor Rc is $(Vs - [Vs/2]) = Vs/2$. If the charging resistor Rc is grounded the voltage across it is $(0 - [Vs/2]) = -(Vs/2)$ and so equal positive and negative excursions are obtained. (Were the resistor Rc connected to −Vs as in the arrangements of FIG. 4(*a*) and (*b*) the voltage across it would be $(-VS - [Vs/2\ ) = -3Vs/2$ and so the negative excursion would be three times the value of the positive excursion for the same Vs.)

In the arrangement of FIG. 6 the inputs of the unbalanced modulator are interchanged so that the charge into or out of the integrator is proportional to the polarity and magnitude of an error signal E, multiplied by the signal polarity Vsp. This arrangement also has better convergence properties than the modulo-2 arrangement of FIG. 1 and leads to a smaller residual error than the arrangements of FIGS. 3, 4 and 5 particularly when used in feedback type equalisers. Linearisation of the f.e.t. is employed and means are incorporated to subtract *Vs*/2 from the charging voltage to equalise the positive and negative excursions, as discussed above.

Rapid initial convergence and minimum residual error may be obtained by making the charge increments into and out of the integrator proportional to both the polarity and magnitude of the tap signal Vs, multiplied by the polarity and magnitude of the error signal. An arrangement incorporating this is shown in FIG. 7. Based on the arrangement of FIG. 5, the variable 'On' resistance of f.e.t.'s 11 and 12 is employed as the charging resistance, and the error signal, instead of being quantised so as to switch the f.e.t.'s 11 and 12 hard ON or hard OFF, is now supplied with a magnitude EM superimposed upon the threshold voltage so that the conductance of the f.e.t.'s 11 and 12 is approximately linearly proportional to the error magnitude. The error polarity Ep is used to direct this magnitude signal to the appropriate f.e.t. This arrangement provides at low cost a close approximation to a mean-square error minimisation algorithm which leads to maximum initial speed of convergence and minimum residual error.

What we claim is:

1. A variable gain circuit arrangement for use in or with an adaptive equaliser comprises integrator means having an input for the application thereto of an applied electrical signal and an output, field effect transistor means connected in the output of said integrator means, a constant voltage source connected directly to the junction of the field effect transistor means and the electrical impedance, and combining means for selectively combining outputs from the field effect transistor means and electrical impedance to afford a required output, modulator means to which the signal is applied, the output of the modulator means being fed to the integrator means, the output of the modulator means being applied to the integrator means via a charge resistance, the modulator means taking the form of a balanced modulator which is operated in dependence upon the output of the voltage source and a derived error signal, and the balanced modulator comprising differential amplifier means having two inputs one of which is earthed and an output, first resistor means connected in series with the other of said inputs and to the output of the voltage source, second resistor means connected between the output of the differential amplifier means and the other input, second field effect transistor means for applying the output of said differential amplifier means to the charge resistance in dependence upon the polarity of an error signal and third field effect transistor means for applying the output of the voltage source to the charge resistance in dependence upon the inverse of the polarity applied to said second field effect transistor means.

2. A variable gain circuit arrangement for use in or with an adaptive equaliser comprises integrator means having an input for the application thereto of an applied electrical signal and an output, field effect transistor means connected in the output of said integrator means, a constant voltage source connected directly to the junction of the field effect transistor means and the electrical impedance, and combining means for selectively combining outputs from the field effect transistor means and electrical impedance to afford a required output, modulator means to which the signal is applied, the output of the modulator means being fed to the integrator means, the output of the modulator means being applied to the integrator means via a charge resistance, the modulator means taking the form of a balanced modulator which is operated in dependence upon the output of the voltage source and a derived error signal, and in which the balanced modulator comprises differential amplifier means having two inputs and an output, first and second resistor means connected respectively between one of said inputs and the output of the voltage source, third resistor means connected between the output of the differential amplifier means and one of said inputs and second field effect transistor means for causing the other of said inputs to be earthed in dependence upon the polarity of an error signal.

3. A variable gain circuit arrangement for use in or with an adaptive equaliser comprises integrator means having an input for the application thereto of an applied electrical signal and an output, field effect transistor means connected in the output of said integrator means, a constant voltage source connected directly to the junction of the field effect transistor means and the electrical impedance, and combining means for selectively combining outputs from the field effect transistor means and electrical impedance to afford a required output, modulator means to which the signal is applied, the output of the modulator means being fed to the integrator means, the output of the modulator means being applied to the integrator means via a charge resistance, and in which the modulator means is of unbalanced form, and in which the integrator means comprises differential amplifier means having two inputs and an output, the charge resistance being connected between the output of the differential amplifier means and the said one input, the other of said inputs being connected to a tap of the electrical impedance.

4. An arrangement as claimed in claim 3, in which the modulator means comprises second field effect transistor means for connecting the output of the voltage source to the charge resistance in dependence upon the polarity of an error signal and third effect transistor means for connecting the charge resistance to earth in dependence upon the inverse of the polarity applied to the said second field effect transistor means.

5. An arrangement as claimed in claim 3, in which the modulator means comprises second field effect transistor means for connecting the output of the voltage source to the input of the integrator means, and third field effect transistor means for connecting the input of the integrator means to earth, the second and third field effect transistor means being operated in dependence upon the magnitude and polarity of an error signal in combination with a signal dependent upon the threshold voltage of said transistor means, the arrangement being such that the resistance of the second and third transistor means affords the charge resistance connected in the input of the integrator means.

6. An arrangement as claimed in claim 3, in which the modulator means comprises differential amplifier means having two inputs and an output, first resistor means connected in series with one of said inputs, second resistor means connected between the output of the differential amplifier means and the said one input, the other input of said differential amplifier means being connected to a further tap of the electrical impedance, second field effect transistor means for applying an error signal to the free end of said first resistor means in dependence upon the polarity of the output of the voltage source, and third field effect transistor means for applying the inverse of said error signal to the said free end of the first resistor means in dependence upon the inverse of the polarity of the output of the voltage source.

* * * * *